United States Patent
Wu et al.

(10) Patent No.: US 8,002,899 B2
(45) Date of Patent: Aug. 23, 2011

(54) METHOD AND APPARATUS FOR MASK PELLICLE ADHESIVE RESIDUE CLEANING

(75) Inventors: Banqiu Wu, Sunnyvale, CA (US);
Richard Lee, San Francisco, CA (US);
M. Rao Yalamanchili, Sunnyvale, CA (US); Ajay Kumar, Cupertino, CA (US); James S. Papanu, San Rafael, CA (US); Chung-Huan Jeon, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 264 days.

(21) Appl. No.: 12/242,472

(22) Filed: Sep. 30, 2008

(65) Prior Publication Data
US 2010/0078039 A1    Apr. 1, 2010

(51) Int. Cl.
*B08B 7/04* (2006.01)
*B08B 7/00* (2006.01)

(52) U.S. Cl. .......... 134/18; 134/1; 134/1.3; 134/6; 134/33; 134/37; 134/153; 134/184; 134/200; 134/902; 15/21.1; 15/97.1

(58) Field of Classification Search .......... 134/1, 1.3, 134/6, 32, 33, 184, 902, 200, 153, 18, 34, 134/37; 15/21.1, 97.1
See application file for complete search history.

(56) References Cited

U.S. PATENT DOCUMENTS

| | | | |
|---|---|---|---|
| 4,569,695 A * | 2/1986 | Yamashita et al. | 134/1 |
| 4,715,392 A * | 12/1987 | Abe et al. | 134/62 |
| 5,099,557 A * | 3/1992 | Engelsberg | 29/25.01 |
| 5,800,625 A * | 9/1998 | Engelsberg et al. | 134/1 |
| 5,814,156 A * | 9/1998 | Elliott et al. | 134/1 |
| 6,063,208 A * | 5/2000 | Williams | 134/34 |
| 6,209,553 B1 * | 4/2001 | Nagamura et al. | 134/56 R |
| 6,279,249 B1 * | 8/2001 | Dao et al. | 34/61 |
| 6,594,847 B1 * | 7/2003 | Krusell et al. | 15/102 |
| 6,908,567 B2 * | 6/2005 | Uziel | 216/66 |
| 7,008,487 B1 * | 3/2006 | Hedges et al. | 134/33 |
| 7,673,637 B2 * | 3/2010 | Pan | 134/78 |
| 2005/0183754 A1 * | 8/2005 | Kago et al. | 134/56 R |
| 2007/0132989 A1 * | 6/2007 | Kaller et al. | 356/239.1 |

(Continued)

FOREIGN PATENT DOCUMENTS

JP          07153730 A  *  6/1995

*Primary Examiner* — Alexander Markoff
(74) *Attorney, Agent, or Firm* — Patterson & Sheridan, L.L.P.

(57) ABSTRACT

Aspects of the invention generally provide methods and apparatus for cleaning adhesive residual on a photomask substrate. In one embodiment, the apparatus includes a processing cell, a support assembly configured to receive a photomask substrate disposed thereon disposed in the processing cell, a protection head assembly disposed above and facing the support assembly, and a head actuator configured to control the elevation of the protection head assembly relative to an upper surface of the support assembly. A cleaning device is provided and positioned to interact with the photomask substrate disposed on the support assembly. In another embodiment, a method of cleaning a periphery region of a photomask substrate includes providing a photomask substrate having a periphery portion and a center portion disposed on a support assembly in a processing cell, lowering a protection cover disposed in the processing cell to cover the center portion of the photomask substrate, providing a brush in the processing cell to clean the periphery portion of the photomask substrate.

24 Claims, 4 Drawing Sheets

U.S. PATENT DOCUMENTS

2007/0292775 A1 12/2007 Hamada
2008/0057411 A1 3/2008 Carpenter et al.
2008/0094591 A1 4/2008 Eschbach et al.
2008/0124633 A1 5/2008 Nagai et al.
2008/0131795 A1 6/2008 Gallagher et al.

* cited by examiner

METHOD AND APPARATUS FOR MASK PELLICLE ADHESIVE RESIDUE CLEANING

BACKGROUND

1. Field

The present invention relates to methods and apparatus for cleaning a photolithographic substrate, more particularly, methods and apparatus for cleaning adhesive residue on a photolithographic substrate in the manufacture of integrated circuits.

2. Background of the Related Art

The increasing circuit densities have placed additional demands on processes used to fabricate semiconductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates.

Photolithography is a technique used to form precise patterns and structures on the substrate surface and then the patterned substrate surface is etched to form the desired device or features. The photolithographic technique utilizes a photolithographic substrate, such as a reticle, which has corresponding configures of features desired to be transferred to a target substrate, such as a semiconductor wafer. A light source emitting ultraviolet (UV) light or deep ultraviolet (DUV) light is transmitted through the photomask substrate to expose photoresist disposed on the substrate. Generally, the exposed resist material is removed by a chemical process to expose the underlying substrate material. The exposed underlying substrate material is then etched to form the features in the substrate surface while the retained resist material remains as a protective coating for the unexposed underlying substrate material.

An integrated circuit manufacturing process may require several photolithography processes performed at different stages. One reticle may be repeatedly used to reproducibly imprint thousands of substrates. Typically, while performing the photolithography process, a pellicle is used to protect the reticle from particle contamination. Pellicle is a thin transparent membrane which allows lights and radiation to pass therethrough to the recitle. One significant issue for current deep UV lithography is progressive defect (e.g., haze) remaining on the reticle surface during exposure. The removal of progressive defects requires a number of cleaning process sequences, such as de-pellicle of the reticle, removal of pellicle residue, clean process, recitle inspection, a re-pellicle process and/or a second run of one or more portions of the clean process. The removal of the pellicle residue is very challenging as remaining pellicle on the reticle may damage the reticle and result in scrapping of the reticle.

FIG. 1A depicts a conventional photolithographic system 100. The photolithographic system 100 includes a light source 112 that provides light 114 at a desired wavelength to a surface 108 of a reticle 110. A pellicle 102 may be used to protect the surface 108 of the reticle 110 from particle contamination or other sources of contamination while processing. The pellicle 102 may be supported by a frame 104 at an edge 106 of the reticle 110 at a predetermined distance above the reticle surface 108. The pellicle 102 and the frame 104 may be permanently attached to the reticle 110 or may be removable and replaceable from the reticle 110. The pellicle 102 may be applied, stretched, and attached to the frame 104 with organic adhesives. Adhesives may also be used to attach the frame 104 to the reticle 110. The adhesives along with the pellicle 102 may be typically fabricated from polymers or plastic materials with additives and/or solvents. As the pellicle 102 and adhesives are exposed to radiation or light from the light source 112, the material of the pellicle 102, adhesive and solvents may outgas or evaporate, producing one or more types of residual organic compounds. The outgased organic compounds may further reduce pellicle transparency, cause pellicle thinning and accelerate pellicle photodegradation. Thinning of the pellicle 102 may also cause defects or particle contamination on the reticle 110.

Furthermore, after a number of process has been performed and the pellicle 102 and the frame 104 is removed from the reticle 110, the residual organic compounds may remain on the edge 106 of the reticle 110 where the frame 104 was supported, shown as undesired adhesive residue 150 on the reticle edge 106 in FIG. 1B. Since the adhesive residue 150 may be sticky and viscous, the adhesive residue 150 is difficult to remove from the reticle surface by conventional cleaning techniques, resulting in defects and contamination on the reticle surface.

Therefore, there remains a need for a method and an apparatus to clean adhesive residues on a reticle.

SUMMARY

Embodiments of the disclosure generally provide methods and apparatus for cleaning adhesive residue from a photomask substrate. One suitable example of a photomask substrate may be a reticle. In one embodiment, the apparatus includes a processing cell, a support assembly configured to receive a photomask substrate disposed thereon disposed in the processing cell, a protection head assembly disposed above and facing the support assembly, and a head actuator configured to control the elevation of the protection head assembly relative to an upper surface of the support assembly. A cleaning device is provided and positioned to interact with the photomask substrate disposed on the support assembly.

In another embodiment, the apparatus includes a processing cell, a support assembly configured to receive a photomask substrate disposed thereon disposed in the processing cell, wherein the support assembly has a periphery region and a center region to receive a periphery region and a center region of the photomask substrate respectively, a protection head assembly disposed above and facing the support assembly, and a head actuator configured to control the elevation of the protection head assembly relative to an upper surface of the support assembly. A cleaning device is provided and positioned to interact with the photomask substrate disposed on the support assembly In yet another embodiment, a method of cleaning a periphery region of a photomask substrate includes providing a photomask substrate having a periphery portion and a center portion disposed on a support assembly in a processing cell, lowering a protection cover disposed in the processing cell to cover the center portion of the photomask substrate, providing a brush in the processing cell to clean the periphery portion of the photomask substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure include an apparatus and methods for cleaning adhesive residues and contaminations from a photomask substrate. In one embodiment, the apparatus may clean adhesive residues associated with the use of a pellicle during a photolithography process. In another embodiment, the apparatus may clean other residues, defects, and particles from a photomask substrate. In yet another embodiment, the apparatus may clean residues, defects, and particles from a photomask substrate, particularly residues located at edge or peripheral portion of the photomask substrate.

Figures 2A, 2B:
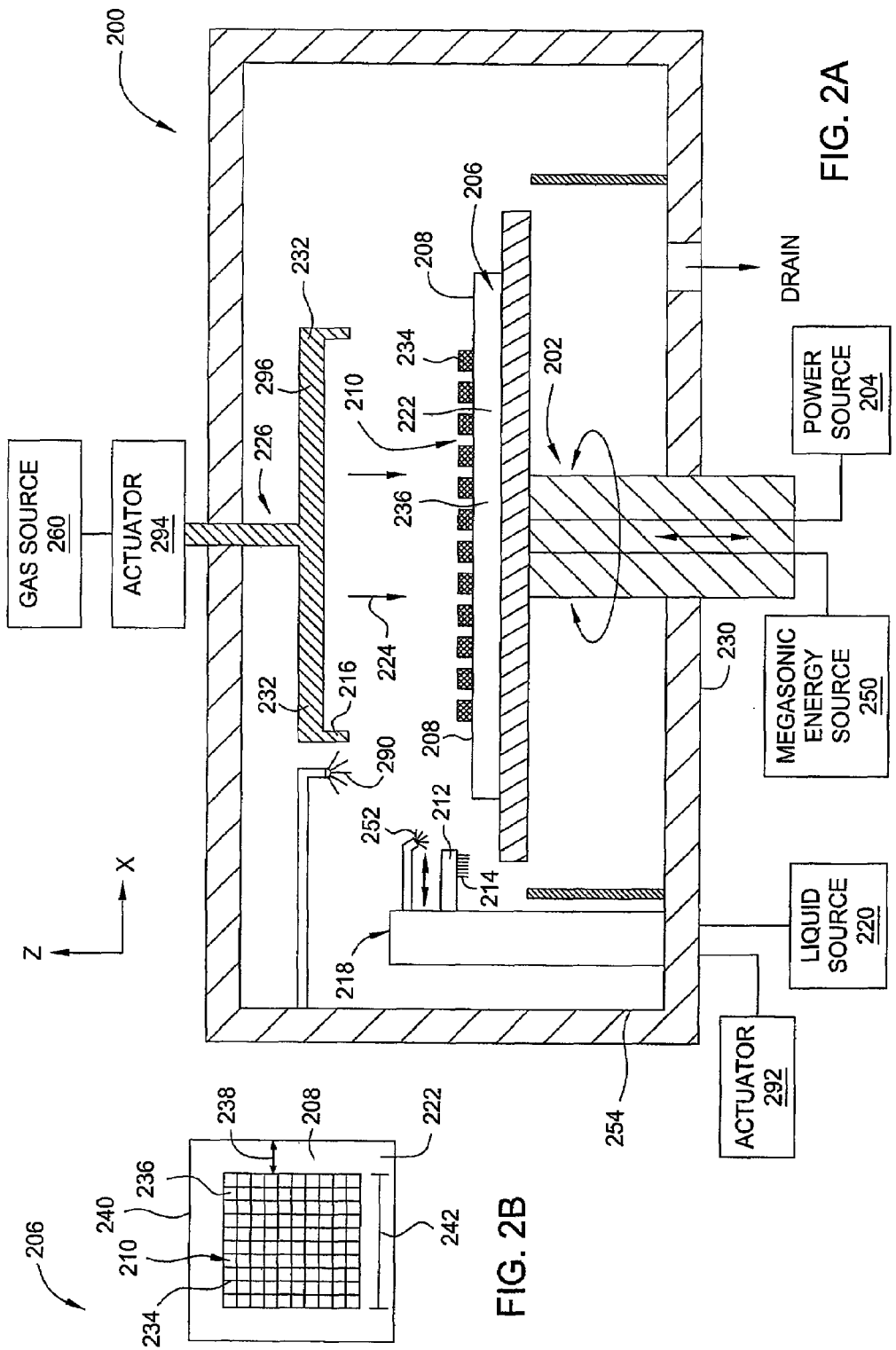
FIG. 2A depicts an apparatus for cleaning adhesive residual on a photomask substrate in accordance with one embodiment of the invention
FIG. 2B depicts a top view of the photomask substrate 206 that may be disposed on the processing cell 200 for cleaning

FIG. 2A depicts an apparatus suitable for cleaning a photomask substrate 206 in accordance with one embodiment of the present invention. In one embodiment, the photomask substrate 206 may be a recitle, a glass substrate, a transparent substrate, or any other suitable substrates. The apparatus includes a processing cell 200 generally comprising a substrate pedestal 202 and a protection cover assembly 226. The substrate pedestal 202 holds the photomask substrate 206 thereon during processing. The substrate pedestal 202 is disposed above a base 230. A power source 204 is coupled to the substrate pedestal 202 to control the elevation of the pedestal 202 so that the substrate pedestal 202 may be moved relative to the base 230 of the processing cell 200. The substrate pedestal 202 may also be rotated about a center axis of the substrate pedestal 202. The substrate pedestal 202 may also include a transducer that is coupled to a megasonic energy source 250 to provide megasonic energy to the photomask substrate 206 during cleaning.

In one embodiment, the photomask substrate 206 generally has a square or other suitable configuration and has a film stack disposed thereon. The film stack includes an optically transparent silicon based material 222, such as quartz layer (i.e., silicon dioxide ($SiO_2$)), having an opaque light-shielding chromium layer 234, known as a photomask material, processed to form patterned features 210 on the surface of the transparent silicon based material 222. The chromium layer 234 may be chromium and/or chromium oxynitride. The film stack may also include an attenuating layer, such as silicon nitride (SiN) doped with molybdenum (Mo) or Molybdenum silicon (MoSi), interposed between the transparent silicon based material 222 and chromium layer 234.

In one embodiment, the patterned features 210 are located in a center portion 236 of the photomask substrate 206 which is circumscribed by an edge or periphery region 208 of the photomask substrate 206. FIG. 2B depicts a top view of the photomask substrate 206. In one embodiment, the photomask substrate 206 has a square shape, each side having a length 240 of between about 6 to about 12 inch. The periphery portion 208 of the photomask substrate 206 typically has a width 238 between about 10 mm and about 24 mm measured from the edge of the photomask substrate 206. Alternatively, the width 238 of the periphery portion 208 may be at between about 5 percent and about 16 percent of the length 240 of the photomask substrate 206. For example, if the length 240 of the photomask substrate 206 is at about 6 inches (152 mm), and the width 238 of the periphery portion 208 may be about 6.6 percent of the length 240 of the photomask substrate 206, the width 238 would then be at about 10 mm (e.g. 10% of 152 mm=15.2 mm≅10 mm).

In contrast, the center portion 236 of the photomask substrate 206 may have a width 242 defined by the width 238 at the both sides of the periphery portion 208. In the embodiment wherein the periphery portion 208 has a greater width 238, the center portion 236 of the photomask substrate 206 therefore has a shorter width 242. The width 238 of the two sides of periphery portion 208 plus the width 242 of the center portion 236 equals the length 240 of the photomask substrate 206. In an exemplary embodiment, the length 240 of the photomask substrate 206 is at about 152 mm and the width 238 of the periphery region 208 is about 24 mm, and the width 242 of the center portion 236 is about 104 mm. In the center region 236 of the photomask substrate 206, desired patterns and features 210 may be formed therein for photolithography manufacturing process.

The protection cover assembly 226 is disposed above and faces the support assembly 202. The protection cover assembly 226 includes a protection head 296 utilized to cover the center portion 236 of the photomask substrate 206 where the patterns and features 210 are formed while the photomask substrate 206 is disposed on the substrate pedestal 202. The protection cover assembly 226 is coupled to an actuator 294 to control elevation of the protection cover assembly 226 relative to the support pedestal 202. The actuator 294 is a motion control devices, such as a linear actuator, x/y tables and the like, that controls the movement of the protection cover assembly 226. A gas source 260 is coupled to the protection head 296. The gas from the gas source 260 provides a positive pressure while the protection head 296 is pressed against the substrate pedestal 202. The positive pressure assists retaining and maintaining the protection head 296 at a predetermined location on the photomask substrate 206.

A sealing ring 216 may be disposed at an edge 232 of the protection head 296 to provide enhanced sealing with the photomask substrate 206 while lowered down and in contact with the photomask substrate 206. The protection head 296 protects the center portion 236 of the photomask substrate 206 from exposure during a cleaning process. In one embodiment, the protection head 296 may be fabricated from a chemical resistive material, such as PTFE (polytetrafluoroethlyene)fluoropolymer, for example TEFLON®. The sealing ring 216 can be made of plastic materials such as PPS, PEEK, and the like.

In one embodiment, the protection head 296 has an adjustable dimension to accommodate different sizes of the photomask substrate 206 disposed on the support assembly 202. For example, if the photomask substrate 206 disposed on the support pedestal 202 has a greater dimension, the size protection head 296 may be selected to have a greater dimension to accommodate the dimension of the photomask substrate 206. In one embodiment, the protection head 296 is configured to have a slightly smaller dimension than the dimension of the photomask substrate 206 to cover the center portion 236 of the photomask substrate 206, leaving periphery portion 208 exposed for cleaning. In one embodiment, the dimension of the protection head 296 is configured to have a width that substantially the same as the width of the center portion 236 of the photomask substrate 206 where the patterns and features 210 are formed thereon. The protection head 296 protects the patterns and features 210 formed on the photomask substrate 206 from chemical and/or mechanical damage, residue contamination, or other sources of contamination that may be generated during the cleaning process. In one embodiment, the protection head 296 has a width between about 106 mm and about 134 mm.

A least one cleaning device is associated with the cell 200 and configured to clean the photomask substrate 206 therein. Examples of cleaning devices include cleaning fluid delivery apparatus, brushes, light sources and energy sources, among others.

In one embodiment, the cleaning device includes a process fluid delivery system 218 is disposed adjacent the substrate pedestal 202. The process fluid delivery system 218 includes a brush 212 and a nozzle 252. The nozzle 252 may have an adjustable height and an adjustable angle relative to the edge of the support pedestal 202 so that fluid may be directed to a desired location in the periphery region 208 of the photomask substrate 206. The brush 212 has a plurality of bristles 214 utilized to sweep particles or residue disposed on the photomask substrate 206.

A process fluid source 220 is used to supply process fluid to the brush 212 and/or the nozzle 252 during cleaning. The flow of the process fluid to the nozzle 252 and the brush 212 may be independently controlled so that the flow of the process fluid from the nozzle 252 and the brush 212 may be provided simultaneously or in any sequence or order as needed. The process fluid supplied to the nozzle 252 and the brush 212 may be of the same or different chemistry to meet different process requirements. In one embodiment, the process fluid supplied from the process fluid source 220 utilized to clean the photomask substrate 206 includes ozonized DI water, solvent, isopropyl alcohol (IPA), methanol, ammonia solution.

In one embodiment, the brush 212 is coupled to an actuator 292 that moves the brush 212 in a linear direction to place the bristles 214 in contact with the periphery region 208 of the photomask substrate 206. Furthermore, the brush 212 may also be moved in a X-Y direction normal the plane of the support 202 and the photomask substrate 206 so that when the brush 212 is in touch with and cleaning the photomask substrate 206, the brush 212 may be moved along the edge and the periphery region 208 of the photomask substrate 206 to clean the areas of the photomask substrate 206 unprotected by the protection head 296. Alternatively or in addition to, the support assembly 202 may rotate during cleaning.

In one embodiment, the cleaning device includes a light source 290 positioned to illuminate the photomask substrate 206 disposed in the cell 200. The light source 290 may be provided in the processing cell 200. The light source 290 may provide radiation, such as a UV light, a laser, or other suitable light, to the periphery region 208 of the photomask substrate 206 to assist removing residue and particles. In one embodiment, the light source 290 may be mounted to a wall 254 of the processing cell. In another embodiment, the light source 290 may be supported from the bottom 230. In yet another embodiment, the light source 290 may be mounted to another suitable location, including internal or external from the processing cell 200, as to direct radiation to the photomask substrate 206.

Figure 2C:
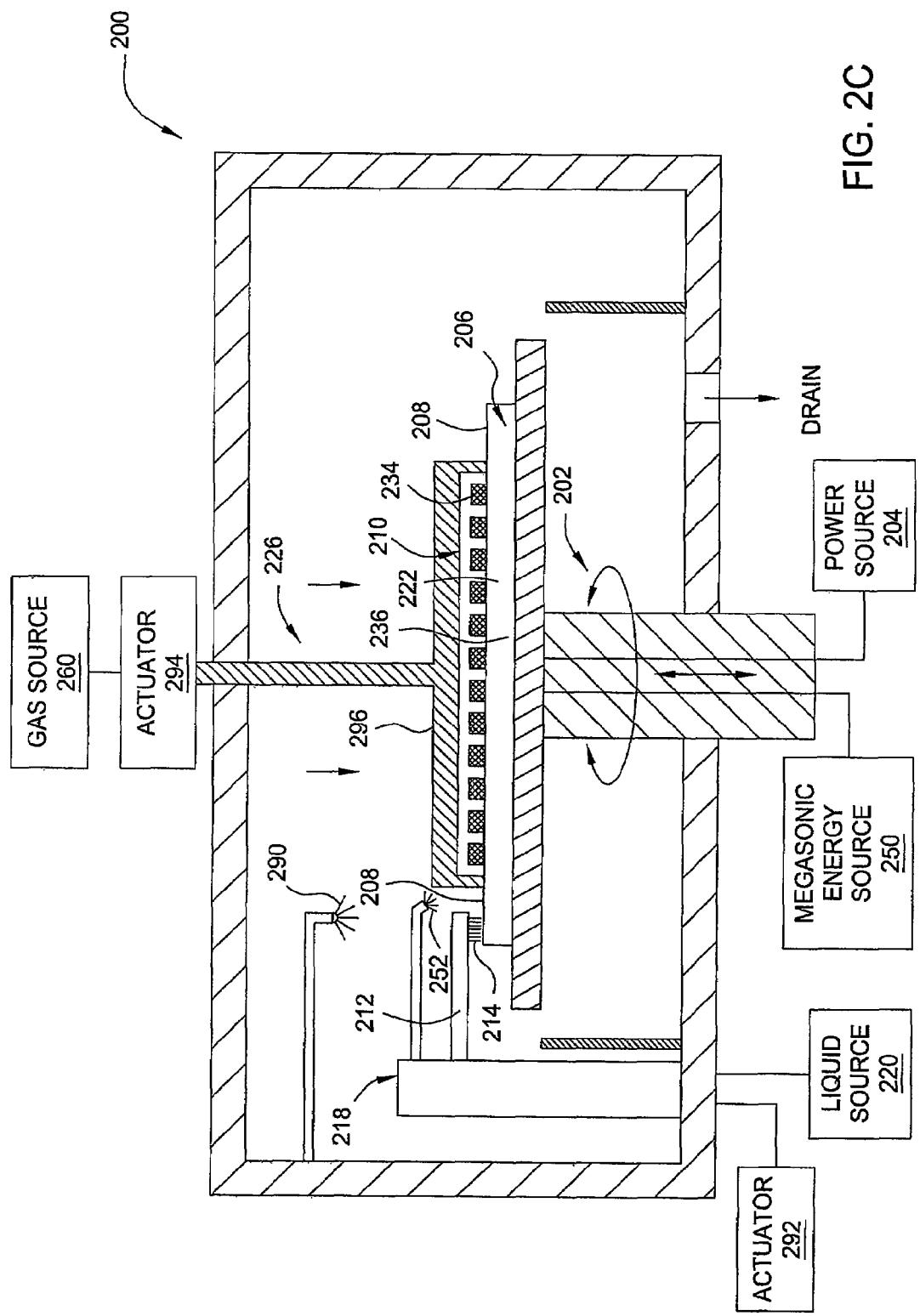
FIG. 2C depicts an apparatus in operation for cleaning adhesive residual on a photomask substrate in accordance with one embodiment of the invention.

In operation, as the photomask substrate 206 is transferred to the support assembly 202 ready for processing, the protection head 296 is lowered to cover and protect the center portion 236 of the photomask substrate 206 from exposure during cleaning, as shown in FIG. 2C. The brush 212 is lowered to contact the periphery region 208 of to commence mechanical and chemical cleaning of the periphery region 208 of the photomask substrate 206 that is outward and unprotected by the protection head 296. The process fluid is supplied from either the brush 212 or the nozzle 252, or both, to assist cleaning. In one embodiment, the brush 212 is moved in a X-Y direction to clean the periphery region 208 along the edge of the photomask substrate 206. Optionally, the brush 212 may spin. After a portion of the periphery region 208 of the photomask substrate 206 has been cleaned, the support assembly 202 may be rotated, for example about 90 degrees, to provide access of a second region of the photomask substrate periphery region 208 to the brush 212 for cleaning. This process may be repeated until the cleaning process has been completely performed around the complete periphery region 208 of the photomask substrate 206. In another embodiment, the brush 212 may be moved around the support pedestal 202 and along the four side of the photomask substrate 206 to sequentially clean each side of the photomask substrate periphery region 208. In yet another embodiment, the movement and rotation of the brush 212 and the support assembly 202 may be arrangement in a manner or in any combination to clean the photomask substrate periphery region. In some embodiments, the movement and rotation of the brush 212 and the support assembly 202 may be specifically designed to clean a certain location of the photomask substrate 206 to enhance the clean efficiency and effectiveness.

During cleaning, the megasonic energy from the source 250 (another embodiment of a cleaning device) may be applied to assist removing the particles and residues from the photomask substrate 206. The light source 290 provides radiation to assist softening, evaporating and disrupting the particles and residues. The process fluid may be alternatively or simultaneously supplied and sprayed from the nozzle 252 and the brush 212 to assist chemically dissolving residues from the photomask substrate 206.

In one embodiment, the cleaning time may be controlled at between about 5 minutes and about 10 minutes. In another embodiment, the cleaning time may be controlled by performing predetermined process cycles on the photomask substrate 206. For example, the cleaning time may be controlled by performing one to five cycles of completely cleaning of each side (e.g. the four sides) of the photomask substrate 206. In yet another embodiment, the cleaning time may be controlled at a suitable time period until substantially all particles and residues are removed from the photomask substrate 206.

After completion of the cleaning process, the brush 212 and the protection head 296 may be lifted to an upper standby position and the cleaned photomask substrate 206 may be therefore removed from the processing cell 200.

After the photomask substrate 206 has completed the periphery region cleaning process, the photomask substrate 206 may be further transferred to a conventional cleaning module, such as a cleaning tank, or a scrubber cleaning tool, to clean the entire surface of the photomask substrate 206, including both the center portion 236 and the periphery portion 208. Alternatively, a simple surface air spray, such as nitrogen air gun spray, or DI water rinse process may be performed to enhance the entire photomask substrate surface cleanness. In some embodiments, substantially the entire surface of the photomask substrate may be cleaned in the processing cell 200. For example, the photomask substrate 206 may be cleaned in the processing cell 200 by spraying process fluid from the nozzle 252 and/or providing a radiation from the light source 290 to the photomask substrate 206 to assist cleaning. Megasonic energy may be optionally applied during cleaning. During cleaning, the support assembly 202 may be rotated. In one embodiment, the photomask substrate 206 may be further cleaned or immersed in a solution including ammonia to clean the entire surface of the photomask substrate. In another embodiment, the photomask substrate 206 may be further cleaned or immersed in a separate DI water tank for cleaning about 5 minutes to about 10 minutes. In yet another embodiment, the photomask substrate 206 may be further scrubbed cleaned using a solution including ozonized DI water.

Figure 3:
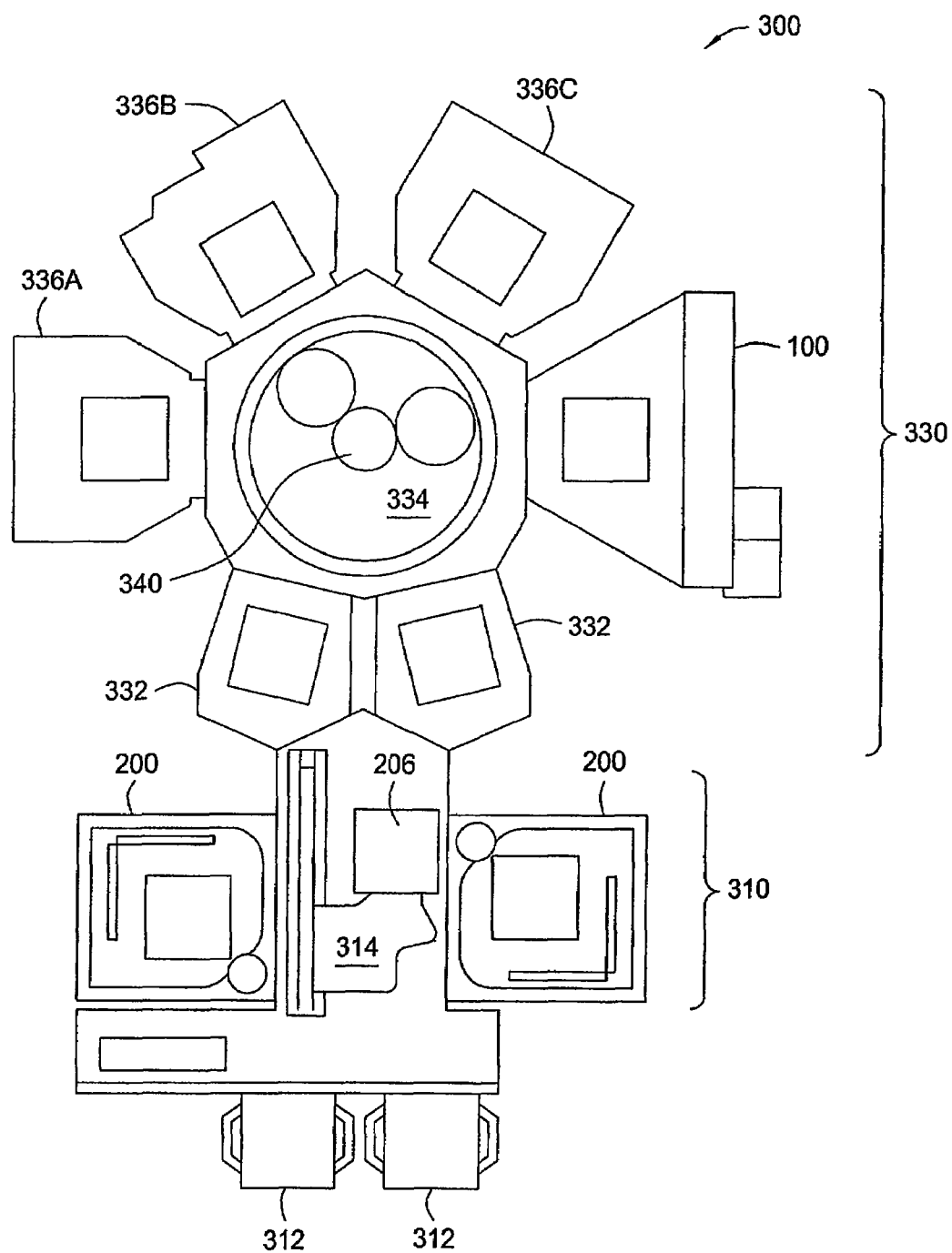
FIG. 3 depicts a system that may have the apparatus of FIG. 2A-B incorporated thereto in accordance with one embodiment of the invention.

FIG. 3 is a schematic view of an exemplary integrated processing system 300 that the processing cell 200 may be incorporated thereto. The integrated processing system 300 comprises a cleaning module 310 and a etching/photolithography mainframe system 330. As shown in FIG. 3, the cleaning module 310 may be an OASIS CLEAN™ system, available from Applied Materials, Inc., located in Santa Clara, Calif. The etching/photolithography mainframe system 330 is a TETRA®, TETRA I®, or TETRA II® system and is also commercially available from Applied Materials, Inc. This particular embodiment of the system is only illustrative and should not be used to limit the scope of the invention, as other cleaning modules and systems, including those from other manufactures, may be adapted to benefit from the invention.

The cleaning module 310 generally includes one or more substrate cassettes 312, one or more transfer robots 314 disposed in a substrate transfer region, and one or more processing cell 200. Other aspects and embodiments of a single-substrate clean system that may be adapted to benefit from the invention are disclosed in U.S. patent application Ser. No. 09/891,849, entitled "METHOD AND APPARATUS FOR WAFER CLEANING," filed Jun. 25, 2001, published as U.S. 2002-0029788, and herein incorporated by reference.

Figure 1A:
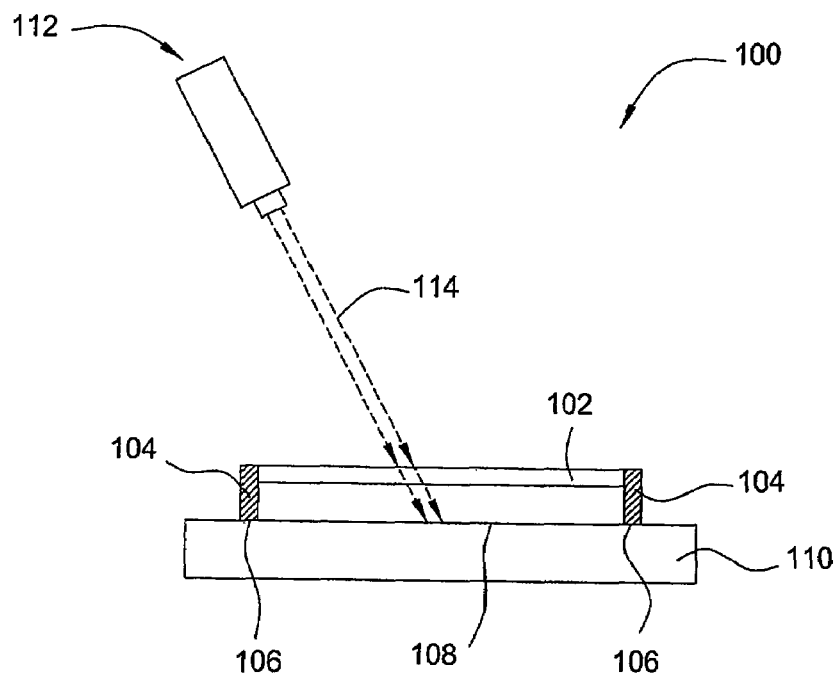
FIG. 1A depicts a schematic cross-sectional view of one embodiment of a recitle disposed in a conventional photolithography system.
Figure 1B:
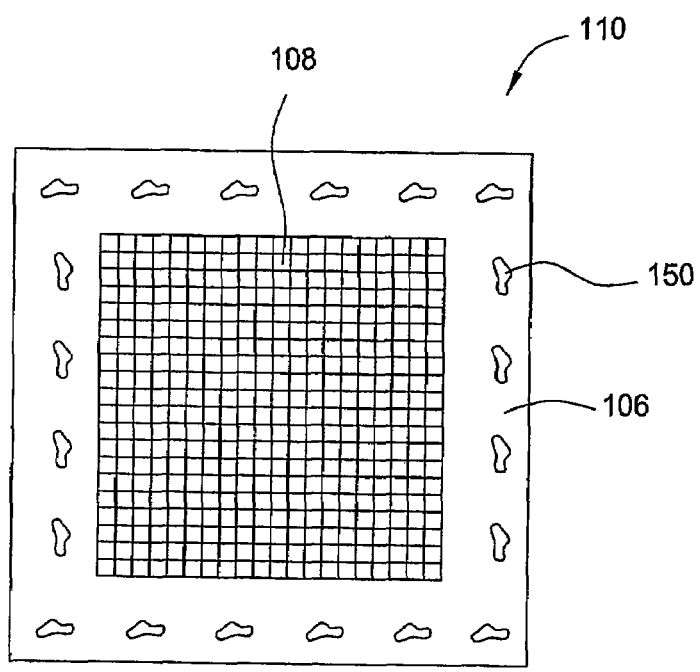
FIG. 1B depicts a top view of a recitle having adhesive residual remained thereon after a photolithography process.

The etching/photolithography mainframe system 330 generally includes load lock chambers 332, a transfer chamber 334, and processing chambers 336A, 336B, 336C, and 100. The transfer chamber 334 is maintained from between 1 mTorr to about 100 Torr and comprises a non-reactive gas ambient, such as a $N_2$ ambient. The load lock chambers 332 allow for the transfer of photomask substrates into and out from the etching/photolithography mainframe system 330 while the transfer chamber 334 remains under a low pressure non-reactive environment. The transfer chamber 334 includes a robot 340 having one or more blades which transfers the photomask substrates 206 between the load lock chambers 332 and processing chambers 336A, 336B, 336C, and 100. The photolithography system 100, as depicted in FIG. 1, may also be implemented and incorporated in the mainframe system 330. Any of the processing chambers 336A, 336B, 336C, or 100 may be removed from the etching/photolithography mainframe system 330 if not necessary for the particular process to be performed by the system 330.

One of the processing cell 200 installed in the cleaning module 310 may be interchangeably replaced by a conventional cleaning cell, such as a scrubber clean module or a cleaning tank, to facilitate cleaning the photomask substrate 206. After completion of the periphery region cleaning process performed at the processing cell 200, the photomask substrate 206 may be then transferred to the conventional cleaning cell incorporated in the cleaning module 310 to clean the entire photomask substrate surface, including both the periphery and center region of the photomask substrate, as needed. Alternatively, the photomask substrate 206 may be directly removed from the system 300 after completion of the photomask substrate periphery region cleaning process.

Thus, the present invention provides an apparatus and a method for cleaning a photomask substrate, particularly in a periphery region of the photomask substrate. The apparatus advantageously remove adhesive residuals that may be remained on a photomask substrate after photolithography process without damage patterns and features formed on the photomask substrate.

While the foregoing is directed to the exemplary aspects of the invention, other and further aspects of the invention may be devised without departing from the basic scope thereof, and the scope thereof is determined by the claims that follow.

What is claimed is:

1. An apparatus for cleaning a photomask substrate, comprising:
    a processing cell;
    a support assembly configured to receive a photomask substrate disposed thereon disposed in the processing cell;
    a protection head assembly disposed above and facing the support assembly, wherein the protection head assembly includes a protection head coupled to a gas source, wherein the protection head is configured to cover a center region of the photomask substrate disposed on the support assembly configured to receive a gas supplied from the gas source;
    a head actuator configured to control the elevation of the protection head assembly relative to an upper surface of the support assembly; and
    a cleaning device positioned to interact with the photomask substrate disposed on the support assembly.

2. The apparatus of claim 1, wherein the cleaning device comprises:
    a process fluid delivery system configured to direct fluid to the upper surface of the support assembly.

3. The apparatus of claim 1, wherein the cleaning device comprises:
    a brush positioned at an edge of the support assembly.

4. The apparatus of claim 3 further comprising:
    an actuator coupled to the brush.

5. The apparatus of claim 2 further comprising:
    a nozzle coupled to the process fluid delivery system.

6. The apparatus of claim 1, wherein the cleaning device comprises:
    a light source disposed in the processing cell adjacent to the support assembly.

7. The apparatus of claim 6, wherein the light source positioned to direct radiation to an edge of the support assembly.

8. The apparatus of claim 6, wherein the light sources generates UV light or laser to the photomask substrate.

9. The apparatus of claim 2, wherein the process fluid delivery system provides process fluid to the processing cell, wherein the process fluid is selected from a group consisting of ozonized DI water, solvent, isopropyl alcohol (IPA) and methanol.

10. The apparatus of claim 1, further comprising:
a sealing ring coupled to an edge of the protection head.

11. An apparatus of cleaning a periphery region of a photomask substrate, comprising:
a processing cell;
a support assembly configured to receive a photomask substrate disposed thereon disposed in the processing cell, wherein the support assembly has a periphery region and a center region to receive a periphery region and a center region of the photomask substrate respectively;
a protection head assembly disposed above and facing the support assembly, wherein the protection head assembly includes a protection head coupled to a gas source, wherein the protection head is configured to cover the center region of the photomask substrate configured to receive a gas supplied from the gas source;
a head actuator configured to control the elevation of the protection head assembly relative to an upper surface of the support assembly; and
a cleaning device positioned to interact with the photomask substrate disposed on the support assembly.

12. The apparatus of claim 11, wherein the cleaning device comprises:
a process fluid delivery system configured to direct fluid to the upper surface of the support assembly.

13. The apparatus of claim 1, wherein the cleaning device further comprises:
a brush positioned at an edge of the support assembly configured to brush the periphery region of the photomask substrate during processing.

14. The apparatus of claim 11, wherein the cleaning device comprises:
a light source disposed in the processing cell adjacent to the support assembly.

15. The apparatus of claim 11, wherein the cleaning device comprises:
a megasonic energy source coupled to the support assembly.

16. The apparatus of claim 11, wherein the protection head has a width that substantially covers the center portion of the photomask substrate.

17. The apparatus of claim 11, wherein the periphery portion of the photomask substrate has a width of between about 5 percent and about 16 percent of the length of the photomask substrate.

18. A method of cleaning a periphery region of a photomask substrate, comprising:
providing a photomask substrate having a periphery portion and a center portion disposed on a support assembly in a processing cell;
lowering a protection cover coupled to a gas source disposed in the processing cell to cover the center portion of the photomask substrate;
supplying a gas mixture from the gas source to the center portion of the photomask substrate; and
providing a brush in the processing cell to clean the periphery portion of the photomask substrate.

19. The method of claim 18 further comprising:
supplying a cleaning fluid from the brush to the periphery portion of the photomask substrate.

20. The method of claim 18 further comprising:
providing a radiation to the photomask substrate while cleaning the photomask substrate.

21. The method of claim 18 further comprising:
rotating the brush.

22. The method of claim 18 further comprising:
moving the brush along the periphery portion of the photomask substrate.

23. The method of claim 18 further comprising:
providing a megasonic energy to the photomask substrate.

24. The method of claim 18 further comprising:
rotating the support assembly while cleaning.

* * * * *